United States Patent
Zhu et al.

(10) Patent No.: US 10,283,452 B2
(45) Date of Patent: May 7, 2019

(54) THREE-DIMENSIONAL MEMORY DEVICES HAVING A PLURALITY OF NAND STRINGS

(71) Applicant: Yangtze Memory Technologies Co., Ltd., Wuhan, Hubei (CN)

(72) Inventors: Jifeng Zhu, Hubei (CN); Zhenyu Lu, Hubei (CN); Jun Chen, Hubei (CN); Yushi Hu, Hubei (CN); Qian Tao, Hubei (CN); Simon Shi-Ning Yang, Hubei (CN); Steve Wiyi Yang, Hubei (CN)

(73) Assignee: Yangtze Memory Technology Co., Ltd., Wuhan (CN)

( * ) Notice: Subject to any disclaimer, the term of this patent is extended or adjusted under 35 U.S.C. 154(b) by 0 days.

(21) Appl. No.: 15/934,730

(22) Filed: Mar. 23, 2018

(65) Prior Publication Data
US 2019/0088589 A1 Mar. 21, 2019

Related U.S. Application Data

(63) Continuation of application No. PCT/CN2018/077939, filed on Mar. 2, 2018.

(30) Foreign Application Priority Data

Sep. 15, 2017 (CN) .......................... 2017 1 0831396

(51) Int. Cl.
H01L 27/1157 (2017.01)
H01L 23/528 (2006.01)
(Continued)

(52) U.S. Cl.
CPC ............ *H01L 23/528* (2013.01); *H01L 25/18* (2013.01); *H01L 25/50* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 27/11582* (2013.01)

(58) Field of Classification Search
CPC ............... H01L 23/528; H01L 27/1157; H01L 27/11573; H01L 27/11524; H01L 23/5226; H01L 27/11529; H01L 27/11531; H01L 27/11582; H01L 27/11556; H01L 27/11575; H01L 27/11578
See application file for complete search history.

(56) References Cited

U.S. PATENT DOCUMENTS 7,977,725 B2 * 7/2011 Yoon ................... H01L 21/8221
257/296
9,214,409 B2 * 12/2015 Yoo ......................... H01L 23/48
(Continued)

Primary Examiner — Khiem D Nguyen
(74) Attorney, Agent, or Firm — Sterne, Kessler, Goldstein & Fox P.L.L.C.

(57) ABSTRACT

Embodiments of three-dimensional (3D) memory devices and methods for forming the 3D memory devices are disclosed. In an example, a NAND memory device includes a substrate, a plurality of NAND strings on the substrate, one or more peripheral devices above the NAND strings, a single crystalline silicon layer above the peripheral devices, and one or more interconnect layers between the peripheral devices and the NAND strings. In some embodiments, the NAND memory device includes a bonding interface at which an array interconnect layer contacts a peripheral interconnect layer.

13 Claims, 12 Drawing Sheets

(51) Int. Cl.
    *H01L 27/11556*    (2017.01)
    *H01L 27/11582*    (2017.01)
    *H01L 27/11524*    (2017.01)
    *H01L 25/18*        (2006.01)
    *H01L 27/11529*    (2017.01)
    *H01L 27/11573*    (2017.01)
    *H01L 25/00*        (2006.01)

(56) References Cited

U.S. PATENT DOCUMENTS

| | | | |
|---|---|---|---|
| 2009/0278190 A1* | 11/2009 | Kajimoto | H01L 27/115 257/316 |
| 2012/0181602 A1* | 7/2012 | Fukuzumi | H01L 27/0688 257/326 |
| 2013/0083601 A1* | 4/2013 | Liu | H01L 27/11521 365/185.17 |
| 2015/0279852 A1* | 10/2015 | Mizutani | H01L 27/11556 257/315 |
| 2016/0358927 A1* | 12/2016 | Nam | H01L 27/1157 |

\* cited by examiner

10,283,452 B2

THREE-DIMENSIONAL MEMORY DEVICES HAVING A PLURALITY OF NAND STRINGS

CROSS-REFERENCE TO RELATED APPLICATIONS

This application claims priority to Chinese Patent Application No. 201710831396.8 filed on Sep. 15, 2017 and PCT Patent Application No. PCT/CN2018/077939 filed on Mar. 2, 2018 which are incorporated herein by reference in their entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

BRIEF SUMMARY

Embodiments of 3D NAND memory architectures and fabrication methods thereof are disclosed herein.

In some embodiments, a semiconductor apparatus includes a silicon substrate with a memory array (also referred to herein as an "array device") on the silicon substrate and one or more interconnect layers above the array device. The semiconductor apparatus can also include one or more peripheral devices above the one or more interconnect layers. In some embodiments, the semiconductor apparatus includes a single crystalline silicon layer above the one or more peripheral devices. The semiconductor apparatus can further include a plurality of back-end-of-line (BEOL) interconnect layers and pad layers above the single crystalline silicon layer.

In some embodiments, the one or more peripheral devices includes a plurality of metal-oxide-semiconductor (MOS) field-effect-transistors (FETs). In some embodiments, the peripheral devices were formed on a silicon substrate. In some embodiments, the silicon substrate includes doped regions and isolation regions. The silicon substrate can be a thinned silicon substrate, e.g., the single crystalline silicon layer. In some embodiments, the single crystalline silicon layer is part of a silicon substrate that was thinned by suitable techniques, e.g., backside grinding, wet/dry etching, and/or chemical mechanical polishing (CMP). In some embodiments, the single crystalline silicon layer has a thickness between 200 nm to 50 µm. In some embodiments, the single crystalline silicon layer has a thickness between 500 µm to 10 µm. In some embodiments, the single crystalline silicon layer has a thickness between 500 nm to 5 µm. In some embodiments, the single crystalline silicon layer has a thickness less than about 1 µm. The single crystalline silicon layer can be partially or fully doped with n-type and/or p-type dopants. The MOSFETs of the peripheral devices can be used as different functional devices for the semiconductor apparatus, such as page buffers, sense amplifiers, column decoders, and row decoders.

In some embodiments, the one or more interconnect layers include a peripheral interconnect layer, which includes a plurality of conductor layers and contact layers. The interconnect layers can include a plurality of metal layers, in which one or more of the metal layers include tungsten (W), copper (Cu), aluminum (Al), or any other suitable materials. The contact layers can also include W, Cu, Al, or any other suitable materials. The peripheral interconnect layer can transfer electrical signals between different peripheral transistors and between the peripheral device and the array device.

In some embodiments, the one or more interconnect layers also include an array interconnect layer, which includes a plurality of conductor layers and contact layers. The conductor layers can include a plurality of metal layers, in which one or more of the metal layers can include W, Cu, Al, or any other suitable materials. The contact layers can also include W, Cu, Al, or any other suitable materials. The array interconnect layer can transfer electrical signals between different areas of the array device and between the peripheral device and the array device.

In some embodiments, the array device includes a plurality of NAND strings. A NAND string can include a semiconductor channel (e.g., a silicon channel) that extends vertically through a plurality conductor/dielectric layer pairs. The plurality of the conductor/dielectric layer pairs are also referred to herein as a "alternating conductor/dielectric stack." The conductor layer can be used as a word line (electrically connecting one or more control gates). Multiple layers can be formed between the conductor layer (control gate) of the alternating conductor/dielectric stack and the semiconductor channel. In some embodiments, the multiple layers include a tunneling layer, such as a tunneling oxide layer, through which the electrons or holes from the semiconductor channel can tunnel to a storage layer for the NAND string. The multiple layers can also include the storage layer to store charge. The storage or removal of charge in the storage layer can impact the on/off state and/or a conductance of the semiconductor channel. The storage layer can include polycrystalline silicon (polysilicon) or silicon nitride. In some embodiments, the multiple layers further include a blocking layer, such as a silicon oxide layer or a combination of silicon oxide/silicon nitride/silicon oxide (ONO) layers. In some embodiments, the blocking layer includes high dielectric constant (high-k) dielectrics (e.g., aluminum oxide).

In some embodiments, the NAND string further includes an epitaxial silicon layer on a lower end of the semiconductor channel. The epitaxial silicon layer can be epitaxially grown from the silicon substrate below the NAND string.

In some embodiments, the NAND string further includes a select gate formed by one or more lower conductor layers of the alternating conductor/dielectric stack. The select gate can control the on/off state and/or a conductance of the semiconductor channel of the NAND string. The select gate of the NAND string can also be formed by a separate conductor layer below the alternating conductor/dielectric stack. In some embodiments, the NAND string further includes another select gate formed by one or more upper conductor layers of the alternating conductor/dielectric stack. The select gate of the NAND string can also be formed by a separate conductor layer above the alternating conductor/dielectric stack.

In some embodiments, the NAND string is electrically connected to a source contact by a doped region of the silicon substrate. The doped region of the silicon substrate can include p-type dopants. The source contact can extend vertically through the alternating conductor/dielectric stack and can contact the doped region of the silicon substrate at its lower end. In some embodiments, an upper end of the source contact is in contact with a contact above the source contact.

In some embodiments, the array device further includes a plurality of word line contacts, which extend vertically. Each word line contact can include an upper end in contact with a corresponding word line to individually address the corresponding word line of the array device. The plurality of word line contacts can be contact holes and/or contact trenches (e.g., formed by a wet etch process or a dry etch process) filled with a conductor (e.g., W). In some embodiments, the contact holes and contact trenches include a barrier layer, an adhesion layer, and/or a seed layer underneath the conductor. The contact holes and/or contact trenches can be filled by a chemical vapor deposition (CVD) process, a physical vapor deposition (PVD) process, or an atomic layer deposition (ALD) process.

In some embodiments, the interconnect layers above the NAND strings include a plurality of bit line contacts each in contact with an upper end of a corresponding NAND string. The plurality of bit line contacts can include contact vias that are isolated from each other. Each bit line contact can be electrically connected to a corresponding NAND string to individually address the corresponding NAND string. The bit line contacts can be contact holes and/or contact trenches (e.g., formed by a wet etch process or a dry etch process) filled with a conductor (e.g., W). The contact holes and/or contact trenches can be filled using a CVD process, a PVD process, or an ALD process.

In some embodiments, the one or more interconnect layers further includes a bonding interface between two dielectric layers, such as between a silicon nitride layer and a silicon oxide layer. The bonding interface can also be between two conductor layers, such as between two metal (e.g., Cu) layers. In some embodiments, the bonding interface includes both the interface between dielectric layers and the interface between conductor layers. The bonding interface can be formed by chemical bonds between the dielectric layers and/or the conductor layers on both sides of the bonding interface. The bonding interface can be formed by physical interaction (e.g., inter-diffusion) between the dielectric layers and/or the conductor layers on both sides of the bonding interface. In some embodiments, the bonding interface is formed after a plasma treatment or a thermal treatment of the surfaces from both sides of the bonding interface prior to the bonding process.

In some embodiments, the semiconductor apparatus further includes multiple alternating conductor/dielectric stacks. In some embodiments, an inter-stack layer is between adjacent alternating conductor/dielectric stacks. The inter-stack layer can electrically connect a NAND string from an upper alternating conductor/dielectric stack to another NAND string from a lower alternating conductor/dielectric stack. In some embodiments, a NAND string from the upper alternating conductor/dielectric stack is electrically connected to a NAND string from the lower alternating conductor/dielectric stack via a conductor of the inter-stack layer, thereby creating a longer NAND string.

In some embodiments, the semiconductor apparatus further includes one or more through silicon contacts (TSCs) that extend vertically through the silicon substrate with the peripheral devices. The one or more TSCs can contact an interconnect layer (e.g., the peripheral interconnect layer) below the peripheral devices and can also contact another interconnect layer (e.g., the BEOL interconnect layer) above the peripheral devices. The interconnect layer above the peripheral devices can include BEOL interconnect layers and pad layers. The TSCs can include contact holes and/or trenches using dry etch processes followed by filling the contact holes and/or trenches (e.g., Ruined by a wet etch process or a dry etch process) with a conductor material (e.g., W, Cu, or silicides).

In some embodiments, the BEOL interconnect layers transfer electrical signals between devices of the semiconductor apparatus, including the array device and the peripheral device. In some embodiments, pad layers are formed to transfer electrical signals from the semiconductor apparatus to external electrical signal paths. The BEOL interconnect layers can include interconnect conductor layers and contact layers. The interconnect layers and contact layers can include conductor materials, such as, W, Cu, Al, silicides, and/or any other suitable conductor materials. The pad layer can include conductor materials, such as W, Cu, Al, silicides, or any other suitable conductor materials.

An exemplary method for fabricating a semiconductor device includes forming a peripheral device, forming an array device, and bonding the peripheral device and the array device at a bonding interface. The exemplary method further includes forming the peripheral device, including MOS transistors, on a first silicon substrate, and forming a peripheral interconnect layer for the peripheral device.

In some embodiments, the exemplary method further includes forming doped regions and isolation regions in a second silicon substrate, and forming one or more NAND strings on the second silicon substrate. The NAND strings include a plurality of conductor/dielectric layer pairs, a semiconductor channel that extends vertically through the plurality of conductor/dielectric layer pairs, a tunneling layer between the semiconductor channel and the conductor/dielectric layer pairs, a storage layer including a plurality of storage units between the tunneling layer and the conductor/dielectric layer pairs, and a blocking layer between the storage layer and the conductor/dielectric layer pairs. The NAND strings can contact the second silicon substrate. Each NAND string can include a select gate at an end of the NAND string.

In some embodiments, the exemplary method further includes forming an array interconnect layer for the NAND strings. The array interconnect layer can include bit line contacts in contact with the NAND strings. The array interconnect layer can also include one or more conductor layers and contact layers, each of which includes conductor materials, such as W, Al, Cu, or any other suitable conductor materials.

The array interconnect layer can further include a source contact for the NAND strings. The source contact can extend vertically through the alternating conductor/dielectric stack. The source contact can contact the second silicon substrate on an end and can contact the array interconnect layer on another end. In some embodiments, the source contact is electrically connected to the NAND strings by a doped region of the second silicon substrate.

The peripheral device can be bonded to the array device by flipping the peripheral device upside down, aligning the peripheral interconnect layer facing down towards the array device with the array interconnect layer facing up (in a face-to-face manner), placing the peripheral device above the array device so that the peripheral interconnect layer is above and in contact with the array interconnect layer, performing a bonding treatment, and forming a bonding interface between the array interconnect layer and the peripheral interconnect layer. In some embodiments, the bonding treatment includes a plasma process, a wet process, and/or a thermal process to create physical or chemical bonds between the array interconnect layer and the peripheral interconnect layer at the bonding interface. In some embodiments, the array interconnect layer includes a silicon nitride layer or a silicon oxide layer, and the peripheral interconnect layer includes a silicon oxide layer or a silicon nitride layer. In some embodiments, the conductors of the array interconnect layer and the peripheral interconnect layer include Cu.

In some embodiments, the bonding between the array interconnect layer and the peripheral interconnect layer is formed by physical interaction (e.g., inter-diffusion) between the dielectric layers (e.g., a silicon nitride layer and a silicon oxide layer) and/or the conductor layers at an interface. The interface between the array interconnect layer and the peripheral interconnect layer is referred to herein as a "bonding interface." In some embodiments, before the bonding process, a plasma treatment on surfaces of the array interconnect layer and the peripheral interconnect layer is performed to enhance the bonding strength between the surfaces. Prior to the bonding process, a wet process treatment on the surfaces of the array interconnect layer and the peripheral interconnect layer can be performed as well to enhance the bonding strength. In some embodiments, placement of the peripheral interconnect layer above the array interconnect layer includes aligning contact areas of the array interconnect layer with the peripheral interconnect layer to ensure electrical contact when the two interconnect layers are bonded. In some embodiments, after the interconnect layers have made contact with one another, a thermal treatment is performed to boost inter-diffusion between the conductor materials (e.g., Cu) from the array interconnect layer and the peripheral interconnect layer.

In some embodiments, one or more bonding interfaces can be formed by the fabrication method. For example, multiple array devices can be bonded with the peripheral device. In another example, the array device can be bonded with multiple peripheral devices. In still another example, multiple array devices can be bonded with multiple peripheral devices.

In some embodiments, the array device can include more than one alternating conductor/dielectric stack. Each alternating conductor/dielectric stack can include a plurality of conductor/dielectric layer pairs. In some embodiments, an inter-stack layer is formed between adjacent alternating conductor/dielectric stacks. The inter-stack layer can electrically connect a NAND string from an upper alternating conductor/dielectric stack with another NAND strings from a lower alternating conductor/dielectric stack.

The exemplary method can further include, after bonding the array device and the peripheral device, thinning the first silicon substrate of the peripheral device. The thinning of the first silicon substrate can be performed by a CMP process, a wet etch process, a dry etch process, or any combination thereof.

In some embodiments, the order of forming the array device/array interconnect layer and the peripheral device/peripheral interconnect layer can be modified, or the fabrication of the array device/array interconnect layer and the fabrication of the peripheral device/peripheral interconnect layer can be performed in parallel.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
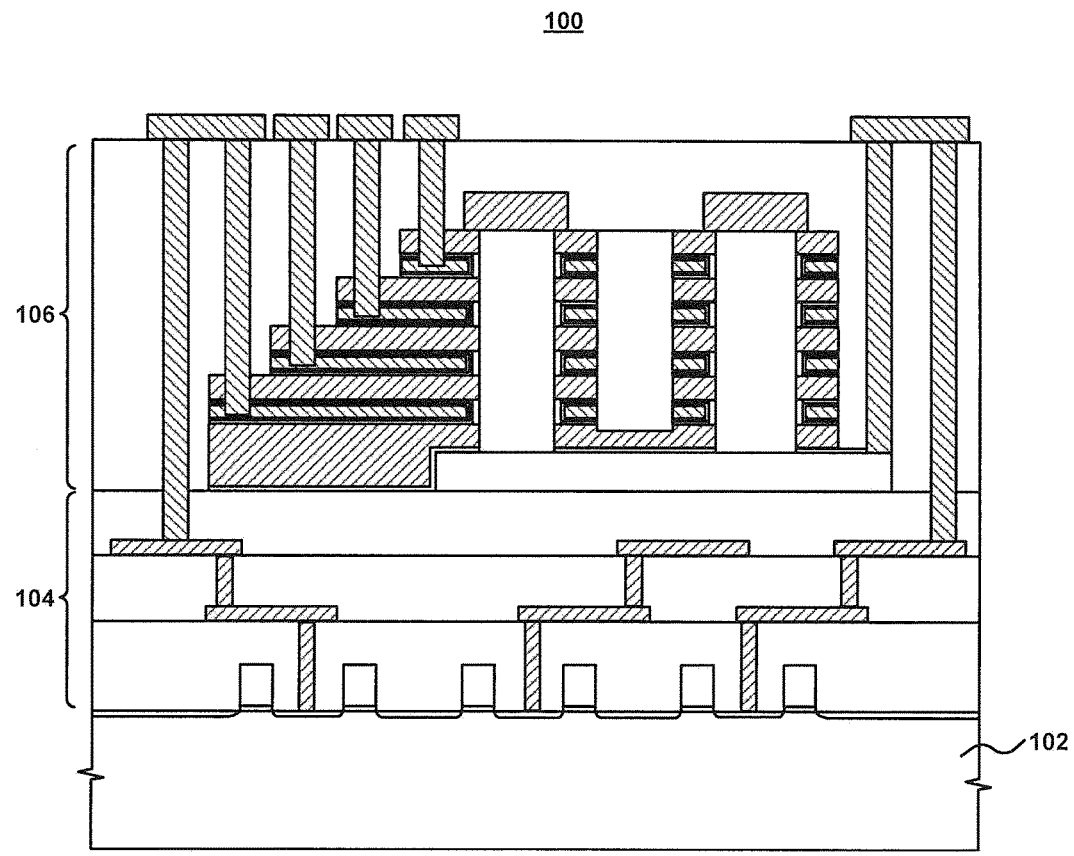
FIG. 1 illustrates a cross-section of an exemplary 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The semiconductor apparatus can be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally oriented substrate so that the memory strings extend in the vertical direction with respect to the substrate. As used herein, the term "vertical/vertically" means nominally perpendicular to the lateral surface of a substrate.

Various embodiments in accordance with the present disclosure provide a 3D memory device with smaller die size, higher device density, and improved performance compared with other 3D memory devices. By vertically stacking a peripheral device and BEOL interconnect above an array device, the density of 3D memory devices can be increased. Moreover, by decoupling the peripheral device processing and the array device processing, the thermal budget associated with processing the array device is not limited by the peripheral device performance requirement; similarly, the peripheral device performance is not impacted by the array device processing. For example, the peripheral device and the array device can be separately fabricated on different substrates so that certain high-temperature processes for fabricating the array device will not adversely affect the fabrication of the peripheral device (e.g., avoid excess diffusion of the dopants, control the doping concentration and/or thickness of ion implantation, etc.).

FIG. 1 illustrates a cross-section of an exemplary 3D memory device 100. 3D memory device 100 includes a substrate 102 and peripheral devices on substrate 102. An interconnect layer 104 for the peripheral devices is formed above substrate 102. A memory array structure 106 is formed above interconnect layer 104.

3D memory device 100 represents an example of a monolithic 3D memory device. The term "monolithic" means that the components of the 3D memory device are formed on a single substrate. For monolithic 3D memory devices, the fabrication encounters additional restrictions due to the convolution of the peripheral device processing and the memory array processing. For example, the fabrication of memory array structure (e.g., NAND strings) is constrained by the thermal budget associated with the peripheral devices that have been formed or to be formed on the same substrate. In contrast, as described in detail in the present disclosure, components of a 3D memory device (e.g., peripheral devices and memory array structures) can be formed separately on different substrates and then joined to form a non-monolithic 3D memory device. The de-convolution of the peripheral device processing and memory array processing from each other can improve the performance of the resulting 3D memory device.

Figure 2:
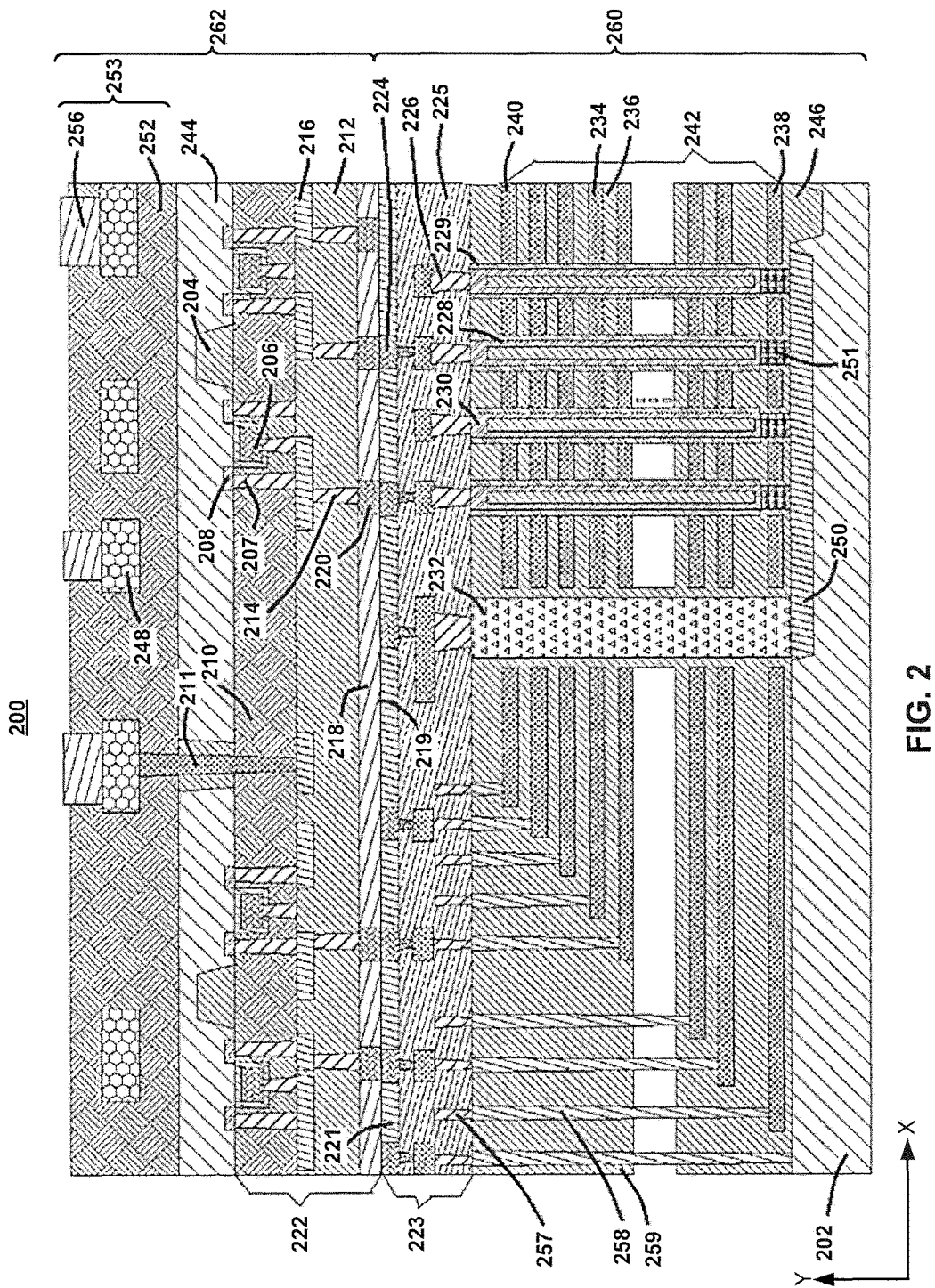
FIG. 2 illustrates a cross-section of a 3D memory device, according to some embodiments.

FIG. 2 illustrates a cross-section of an exemplary 3D memory device 200 according to some embodiments of the present disclosure. 3D memory device 200 can include a substrate 202, which can include silicon (e.g., single crystalline silicon), silicon germanium (SiGe), gallium arsenide (GaAs), germanium (Ge), silicon on insulator (SOI), or any other suitable materials.

3D memory device 200 can include a memory array device above substrate 202. It is noted that x and y axes are added in FIG. 2 to further illustrate the spatial relationship of the components in 3D memory device 200. Substrate 202 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., 3D memory device 200) is determined relative to the substrate of the semiconductor device (e.g., substrate 202) in the y-direction (the vertical direction or thickness direction) when the substrate is positioned in the lowest plane of the semiconductor device in the y-direction. The same notion for describing spatial relationship is applied throughout the present disclosure.

As shown in FIG. 2, 3D memory device 200 is a NAND Flash memory device in which memory cells are provided in the form of a plurality of NAND strings 230 extending vertically above substrate 202. The array device can include a plurality of NAND strings 230 that extends through a plurality of conductor layer 234 and dielectric layer 236 pairs 242. The plurality of conductor/dielectric layer pairs 242 are also referred to herein as an "alternating conductor/dielectric stack." Conductor layers 234 and dielectric layers 236 in alternating conductor/dielectric stack 242 alternate in the vertical direction. In other words, except the ones at the top or bottom of alternating conductor/dielectric stack 242, each conductor layer 234 can be adjoined by two dielectric layers 236 on both sides, and each dielectric layer 236 can be adjoined by two conductor layers 234 on both sides. Conductor layers 234 can have the same thickness or can have different thicknesses. Similarly, dielectric layers 236 can each have the same thickness or can have different thicknesses. In some embodiments, alternating conductor/dielectric stack 242 can include more conductor layers or more dielectric layers with different materials and/or thicknesses than the conductor/dielectric layer pair. Conductor layer 234 can include conductor materials, such as tungsten (W), cobalt (Co), copper (Cu), aluminum (Al), doped silicon, silicides, any other suitable conductor materials, or any combination thereof. Dielectric layer 236 can include dielectric materials, such as silicon oxide, silicon nitride, silicon oxynitride, any other suitable dielectric materials, or any combination thereof.

As shown in FIG. 2, each NAND string 230 can include a semiconductor channel 228 and a dielectric layer 229 (also known as "memory film"). In some embodiments, semiconductor channel 228 includes silicon, such as amorphous silicon, polysilicon, or single crystalline silicon. In some embodiments, dielectric layer 229 is a composite layer including a tunneling layer, a storage layer (also known as "charge trap/storage layer"), and a blocking layer. Each NAND string 230 can have a cylinder shape (e.g., a pillar shape). Semiconductor channel 228, the tunneling layer, the storage layer, and the blocking layer are arranged along a direction from the center toward the outer surface of the pillar in this order, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, dielectric layer 229 can include ONO dielectrics (e.g., a tunneling layer including silicon oxide, a storage layer including silicon nitride, and a blocking layer including silicon oxide).

In some embodiments, NAND strings 230 further include a plurality of control gates (each being part of a word line) for NAND strings 230. Each conductor layer 234 in alternating conductor/dielectric stack 242 can act as a control gate for each memory cell of NAND string 230. As shown in FIG. 2, NAND strings 230 can include a select gate 238 (e.g., a source select gate) at a lower end of NAND string 230. NAND strings 230 can also include another select gate 240 (e.g., a drain select gate) at an upper end of the NAND string 230. As used herein, the "upper end" of a component (e.g., NAND string 230) is the end further away from substrate 202 in the y-direction, and the "lower end" of the component (e.g., NAND string 230) is the end closer to substrate 202 in the y-direction. As shown in FIG. 2, for each NAND string 230, source select gate 238 can be below drain select gate 240. In some embodiments, select gates 238 and 240 include conductor materials including, but not limited to, W, Co, Cu, Al, doped silicon, silicides, or any combination thereof.

In some embodiments, 3D memory device 200 includes an epitaxial layer 251 on a lower end of semiconductor channel 228 of NAND string 230. Epitaxial layer 251 can include a semiconductor material, such as silicon. Epitaxial layer 251 can be epitaxially grown from substrate 202. For example, substrate 202 can be a silicon substrate, and epitaxial layer 251 can be a single crystalline silicon layer epitaxially grown from the silicon substrate. Substrate 202 can be undoped, partially doped (in the thickness direction and/or the width direction), or fully doped by p-type or n-type dopants. For each NAND string 230, epitaxial layer 251 is referred to herein as an "epitaxial plug." Epitaxial plug 251 at the lower end of each NAND string 230 can contact both semiconductor channel 228 and a doped region 250 of substrate 202. Epitaxial plug 251 can function as the channel controlled by select gate 238 at the lower end of NAND string 230.

In some embodiments, the array device further includes a source contact 232 that extends vertically through alternating conductor/dielectric stack 242. As shown in FIG. 2, a lower end of source contact 232 can contact doped region 250 of substrate 202 (e.g., an array common source for NAND strings 230). In some embodiments, source contact 232 includes conductor materials including, but not limited to, W, Co, Cu, Al, silicides, or any combination thereof. In some embodiments, substrate 202 includes an isolation region 246. In some embodiments, isolation region 246 can form across the entire thickness of substrate 202.

In some embodiments, the array device further includes one or more word line contacts 258 in a staircase structure region. Word line contacts 258 can extend vertically within a dielectric layer 259. Each word line contact 258 can have an end (e.g., the lower end) in contact with a corresponding conductor layer 234 in alternating conductor/dielectric stack 242 to individually address a corresponding word line of the array device. In some embodiments, each word line contact 258 is above a corresponding word line 234. Word line contacts 258 can be contact holes and/or contact trenches (e.g., formed by a wet etch process or a dry etch process) filled with a conductor (e.g., W). In some embodiments, filling the contact holes and/or contact trenches includes depositing a barrier layer, an adhesion layer, and/or a seed layer before depositing the conductor.

In some embodiments, source contact 232 and NAND strings 230 are both in contact with doped region 250 of substrate 202, so that source contact 232 can be electrically connected to NAND strings 230 when doped region 250 conducts an electrical signals (e.g., when an inversion layer in substrate 202 forms for conduction.)

As shown in FIG. 2, 3D memory device 200 can include an array interconnect layer 223 above the array device and in contact with a peripheral interconnect layer 222. Array interconnect layer 223 can include bit line contacts 226, word line vias 257, one or more conductor layers (e.g., a conductor layer 224), and one or more dielectric layers (e.g., dielectric layers 221 and 225). The conductor layers can include conductor materials including, but not limited to, W, Co, Cu, Al, silicides, or any combination thereof. The dielectric layers can include dielectric materials including, but not limited to, silicon oxide, silicon nitride, low-k dielectrics, or any combination thereof.

As shown in FIG. 2, each bit line contact 226 can contact the upper end of a corresponding NAND string 230 to individually address corresponding NAND string 230. Each word line via 257 can contact the upper end of a corresponding word line contact 258 to individually address a corresponding word line 234 of NAND strings 230.

3D memory device 200 can include a peripheral device (e.g., transistors 206) and a semiconductor layer 244 (e.g., a thinned substrate) above the peripheral device. The entirety or part of the peripheral device can be formed in semiconductor layer 244 (e.g., above the bottom surface of semiconductor layer 244) and/or directly below semiconductor layer 244. The peripheral device can include a plurality of transistors 206. Semiconductor layer 244 can be a thinned substrate on which the peripheral device (e.g., transistors 206) is formed. In some embodiments, semiconductor layer 244 includes a single crystalline silicon, in which semiconductor layer 244 can be referred to as a "single crystalline silicon layer." In some embodiments, semiconductor layer 244 can include SiGe, GaAs, Ge, or any other suitable materials. An isolation region 204 and a doped region 208 (e.g., a source region or a drain region of transistor 206) can be formed in semiconductor layer 244 as well.

In some embodiments, the peripheral device can include any suitable digital, analog, and/or mixed-signal peripheral circuits used for facilitating the operation of 3D memory device 200. For example, the peripheral device can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors).

3D memory device 200 can include peripheral interconnect layer 222 below transistors 206 to transfer electrical signals to and from transistors 206. Peripheral interconnect layer 222 can include one or more contacts, such as a contact 207 and a contact 214, and one or more interconnect conductor layers, such as a conductor layer 216 and a conductor layer 220, each including one or more interconnect lines and/or vias. As used herein, the term "contact" can broadly include any suitable types of interconnects, such as middle-end-of-line (MEOL) interconnects and back-end-of-line (BEOL) interconnects, including vertical interconnect accesses (e.g., vias) and lateral lines (e.g., interconnect lines). Peripheral interconnect layer 222 can further include one or more interlayer dielectric (ILD) layers, such as dielectric layers 210, 212, and 218. That is, peripheral interconnect layer 222 can include conductor layers 216 and 220 and dielectric layers 210, 212, and 218. The contacts and the conductor layers in peripheral interconnect layer 222 can include conductor materials including, but not limited to, W, Co, Cu, Al, silicides, or any combination thereof. The dielectric layers in peripheral interconnect layer 222 can include dielectric materials including, but not limited to, silicon oxide, silicon nitride, silicon oxynitride, doped silicon oxide, or any combination thereof.

A bonding interface 219 can be formed between dielectric layer 218 of peripheral interconnect layer 222 and dielectric layer 221 of array interconnect layer 223. Bonding interface 219 can also be formed between conductor layer 224 of array interconnect layer 223 and conductor layer 220 of peripheral interconnect layer 222. Each of dielectric layer 218 and dielectric layer 221 can include silicon nitride, or silicon oxide.

In some embodiments, a first semiconductor structure 260 is bonded to a second semiconductor structure 262 at bonding interface 219. First semiconductor structure 260 can include substrate 202, array interconnect layer 223, alternating conductor/dielectric stack 242 having a plurality of conductor/dielectric layer pairs, and NAND strings 230. Second semiconductor structure 262 can include semiconductor layer 244 (e.g., a thinned substrate), one or more peripheral devices below semiconductor layer 244, and peripheral interconnect layer 222 below the one or more peripheral devices. First semiconductor structure 260 can include the elements shown below bonding interface 219 in FIG. 2, while second semiconductor structure 262 can include the elements shown above bonding interface 219 in FIG. 2. Peripheral interconnect layer 222 can include conductor layer 220, which contacts conductor layer 224 of array interconnect layer 223 at bonding interface 219. Peripheral interconnect layer 222 can also include dielectric layer 218, which contacts dielectric layer 221 of array interconnect layer 223 at bonding interface 219.

As shown in FIG. 2, 3D memory device 200 can include one or more through silicon contacts (TSCs) 211 that extend vertically through semiconductor layer 244. The lower end of TSC 211 can be in contact with a conductor layer of peripheral interconnect layer 222 (e.g., conductor layer 216). The upper end of TSC 211 can be in contact with a BEOL conductor layer 248 and/or pad layers 256 above semiconductor layer 244. TSC 211 can be formed in an isolation region that extends through the entire thickness of semiconductor layer 244, so that TSC 211 can be electrically isolated from other parts of semiconductor layer 244 (e.g., doped regions 208). In some embodiments, TSC 211 carries electrical signals from the one or more peripheral devices to BEOL conductor layer 248 and/or pad layer 256. In some embodiments, TSC 211 can include a vertical opening (e.g., a contact hole or a contact trench) through semiconductor layer 244 formed by dry/wet etch process, followed by filling the opening with conductor materials and other materials (e.g., dielectric material) for isolation purposes. TSC 211 can include conductor materials including, but not limited to, W, Co, Cu, Al, doped silicon, silicides, or any combination thereof. Dielectric materials can be deposited in the opening prior to the filling of conductor materials. Dielectric materials can include, but not limited to, silicon oxide, silicon nitride, silicon oxynitride, doped silicon oxide, or any combination thereof.

As shown in FIG. 2, 3D memory device 200 can further include a BEOL interconnect layer 253 above semiconductor layer 244. In some embodiments, BEOL interconnect layer 253 includes conductor layer 248, one or more dielectric layers (e.g., a dielectric layer 252), and one or more pad layers (e.g., pad layer 256). BEOL interconnect layer 253 can transfer electrical signals between 3D memory device 200 and external circuits. The conductor layers, contact layers, and pad layers in BEOL interconnect layer 253 can include conductor materials, such as W, Co, Cu, Al, silicides, any other suitable conductor material, or any combination thereof. The dielectric layers in BEOL interconnect layer 253 can include dielectric materials, such as silicon oxide, silicon nitride, low-k dielectrics, any other suitable dielectric material, or any combination thereof.

BEOL interconnect layer 253 can be electrically connected to the one or more peripheral devices. Specifically, TSC 211 can extend vertically through semiconductor layer 244, dielectric layer 210, and at least part of dielectric layer 252. TSC 211 can contact a conductor layer of BEOL interconnect layer 253 (e.g., conductor layer 248) and a conductor layer of peripheral interconnect layer 222 (e.g., conductor layer 216).

Figure 6:
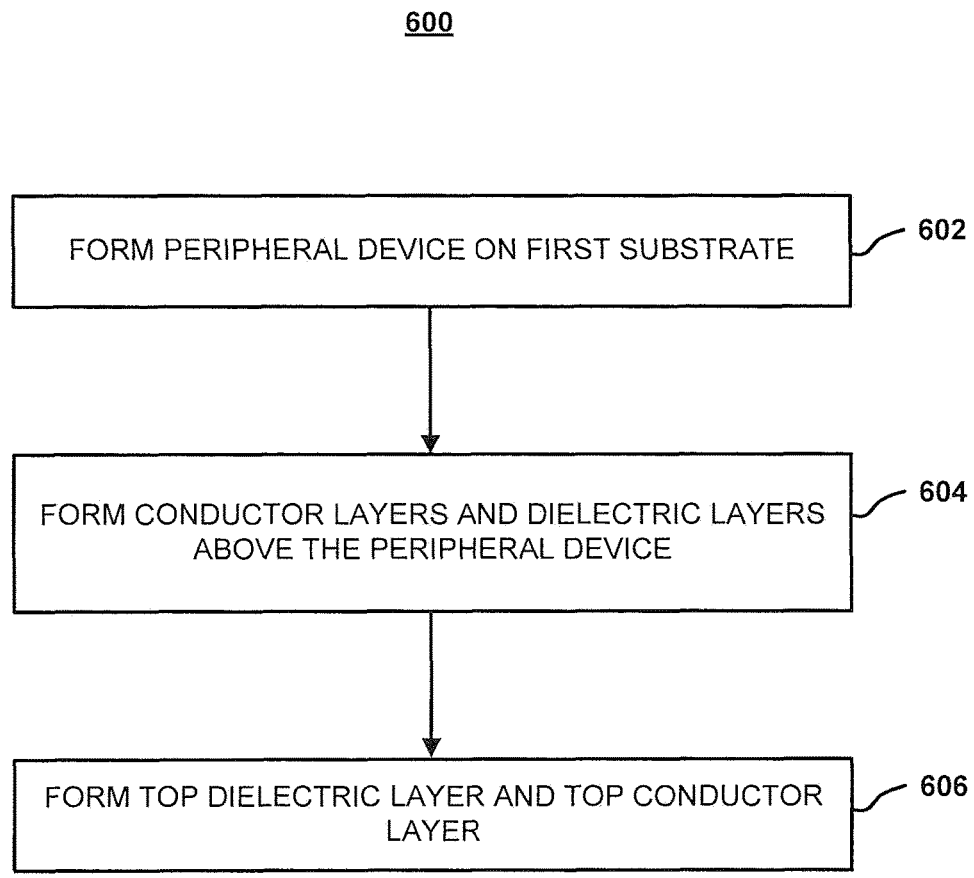
FIG. 6 is a flowchart of an exemplary method for forming a peripheral device and a peripheral interconnect layer, according to some embodiments.

FIG. 3A to FIG. 3D illustrate an exemplary fabrication process for forming a peripheral device and a peripheral interconnect layer. FIG. 6 is a flowchart of an exemplary method 600 for forming a peripheral device and a peripheral interconnect layer. An example of the peripheral device and peripheral interconnect layer depicted in FIGS. 3A-3D and FIG. 6 is the peripheral device (e.g., transistors 206) and peripheral interconnect layer 222 depicted in FIG. 2. It should be understood that the operations shown in method 600 are not exhaustive and that other operations can be performed as well before, after, or between any of the illustrated operations.

Figure 3A:
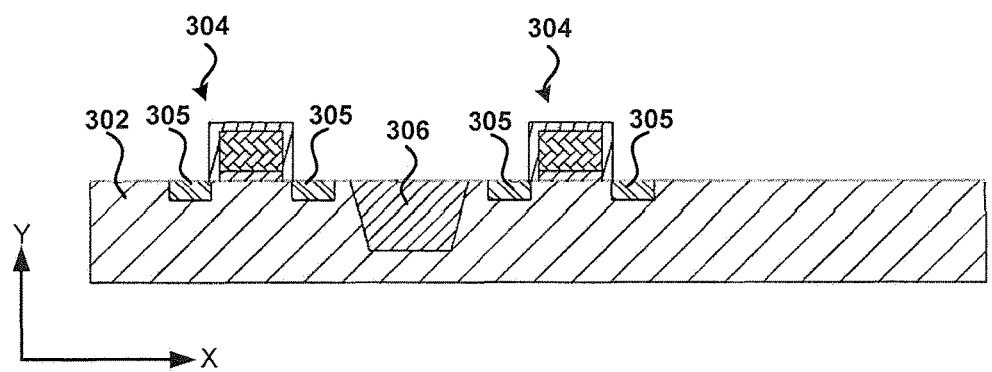
FIGS. 3A-3D illustrate an exemplary fabrication process for forming a peripheral device and a peripheral interconnect layer, according to some embodiments.

Referring to FIG. 6, method 600 starts at operation 602, in which a peripheral device is formed on a first substrate. The first substrate can be a silicon substrate. As illustrated in FIG. 3A, a peripheral device is formed on a first silicon substrate 302. The peripheral device can include a plurality of transistors 304 formed on first silicon substrate 302. Transistors 304 can be formed by a plurality of processing steps including, but not limited to, photolithography, dry/wet etch, thin film deposition, thermal growth, implantation, CMP, or any combination thereof. In some embodiments, doped regions 305 are formed in first silicon substrate 302. In some embodiments, an isolation region 306 is also formed in first silicon substrate 302.

Figure 3B:
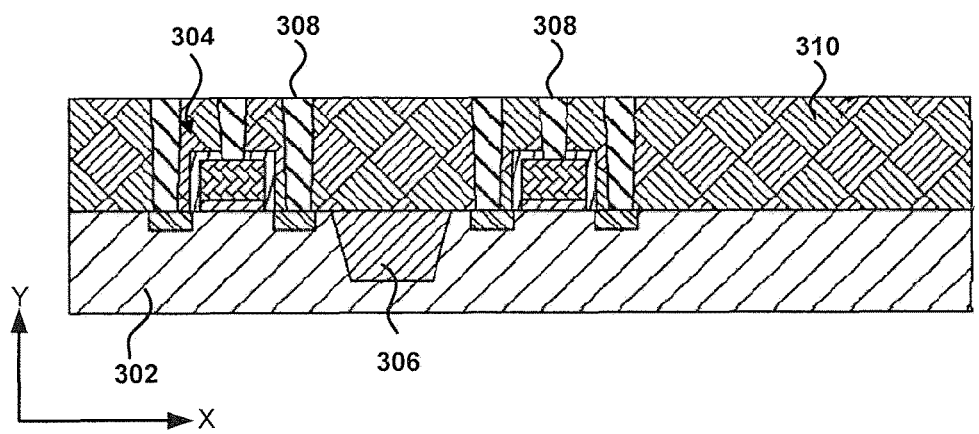

Method 600 proceeds to operation 604, as illustrated in FIG. 6, in which one or more dielectric layers and conductor layers are formed above the peripheral device. As illustrated in FIG. 3B, a first dielectric layer 310 can be formed on first silicon substrate 302. First dielectric layer 310 can include a contact layer 308, including MEOL contacts, to make electrical connections with the peripheral device (e.g., transistors 304).

Figure 3C:
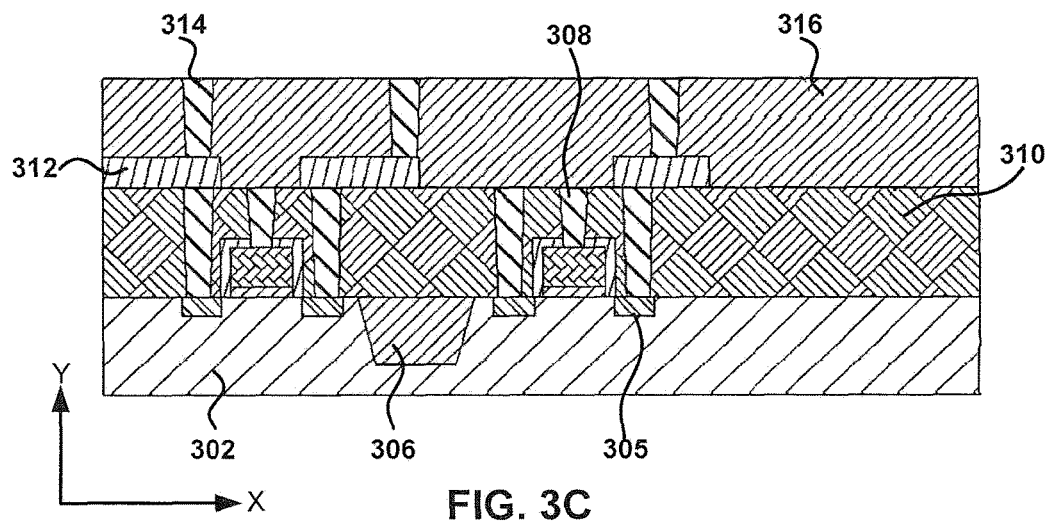

As illustrated in FIG. 3C, a second dielectric layer 316 is formed on first dielectric layer 310. In some embodiments, second dielectric layer 316 is a combination of multiple layers and can be formed in separate steps. For example, second dielectric layer 316 can include a conductor layer 312 and a contact layer 314. The conductor layers (e.g., conductor layer 312) and contact layers (e.g., contact layers 308 and 314) can include conductor materials deposited by one or more thin film deposition processes including, but not limited to, CVD, PVD, ALD, electroplating, electroless plating, or any combination thereof. Fabrication processes for forming the conductor layers and contact layers can also include photolithography, CMP, wet/dry etch, or any combination thereof. The dielectric layers can be formed by thin film deposition processes including, but not limited to, CVD, PVD, ALD, or any combination thereof.

Figure 3D:
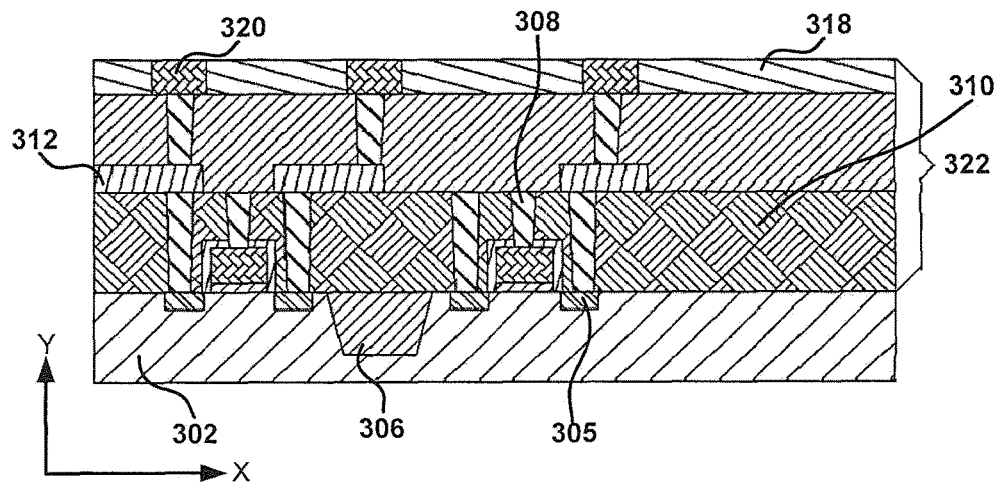

Method 600 proceeds to operation 606, as illustrated in FIG. 6, in which a top dielectric layer and a top conductor layer of a peripheral interconnect layer are formed. The dielectric layers and conductor layers formed at operations 604 and 606 can be collectively referred to as an "interconnect layer" (e.g., the peripheral interconnect layer). Each of the dielectric layers and conductor layers can be a portion of the peripheral interconnect layer that transfers electrical signals to and from the peripheral device. As illustrated in FIG. 3D, a third dielectric layer (the top dielectric layer) 318 is formed on second dielectric layer 316, and a top conductor layer 320 is formed in third dielectric layer 318. As a result, a peripheral interconnect layer 322 is formed. The conductor layer (e.g., conductor layer 320) can include conductor materials deposited by one or more thin film deposition processes including, but not limited to, CVD, PVD, ALD, electroplating, electroless plating, or any combination thereof. Fabrication processes to form the conductor layer and contact layers can also include photolithography, CMP, wet/dry etch, or any combination thereof. The dielectric layers (e.g., dielectric layer 318) can include dielectric layers deposited by one or more thin film deposition processes including, but not limited to, CVD, PVD, ALD, or any combination thereof.

Figure 7:
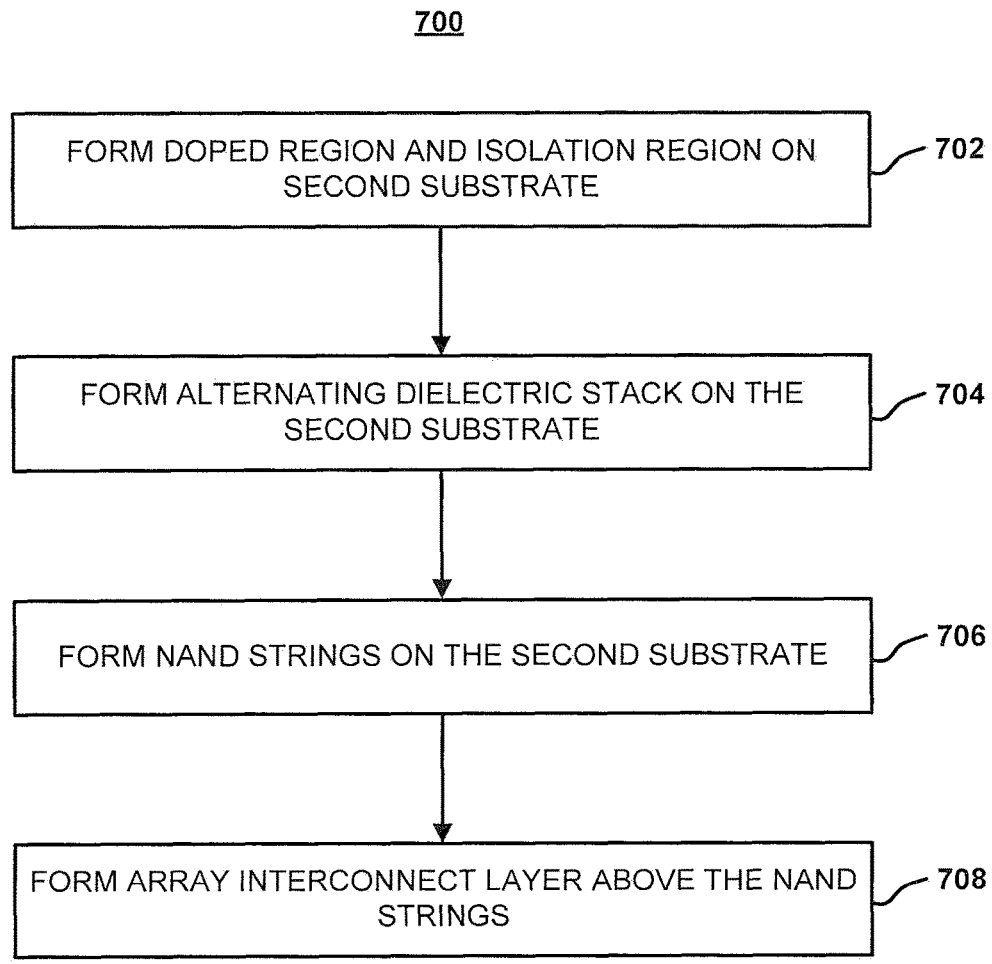
FIG. 7 is a flowchart of an exemplary method for foiling an array device and an array interconnect layer, according to some embodiments.

FIG. 4A to FIG. 4D illustrate an exemplary fabrication process for forming an array device and an array interconnect layer. FIG. 7 is a flowchart of an exemplary method 700 for forming an array device and an array interconnect layer. An example of the array device and array interconnect layer depicted in FIGS. 4A-4D and FIG. 7 is the array device (e.g., NAND strings 230) and array interconnect layer 223 depicted in FIG. 2. It should be understood that the operations shown in method 700 are not exhaustive and that other operations can be performed as well before, after, or between any of the illustrated operations.

Referring to FIG. 7, method 700 starts at operation 702, in which a doped region and an isolation region are formed in a second substrate. The second substrate can be a silicon substrate, such as a second silicon substrate 402 in FIG. 4A. An array device can be formed on second silicon substrate 402. In some embodiments, a doped region 404 and an isolation region 406 are formed in second silicon substrate 402. Doped region 404 can be formed by ion implantation and/or diffusion. Isolation region 406 can be formed by thermal growth and/or thin film deposition. Patterning process (e.g., photolithography and dry/wet etch) can be used for patterning doped region 404 and isolation region 406 in second silicon substrate 402.

Figure 4A:
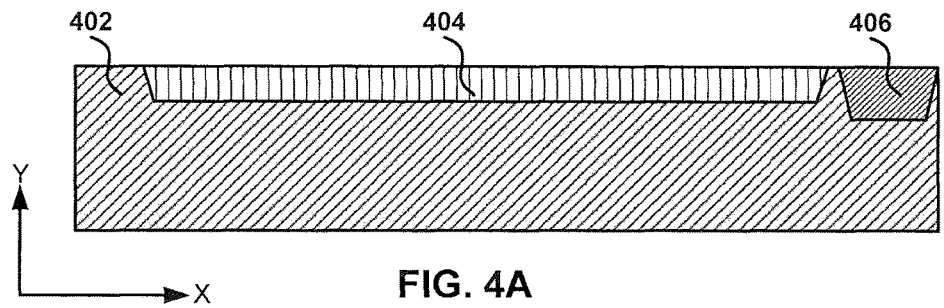
FIGS. 4A-4D illustrate an exemplary fabrication process for forming an array device and an array interconnect layer, according to some embodiments.
Figure 4B:
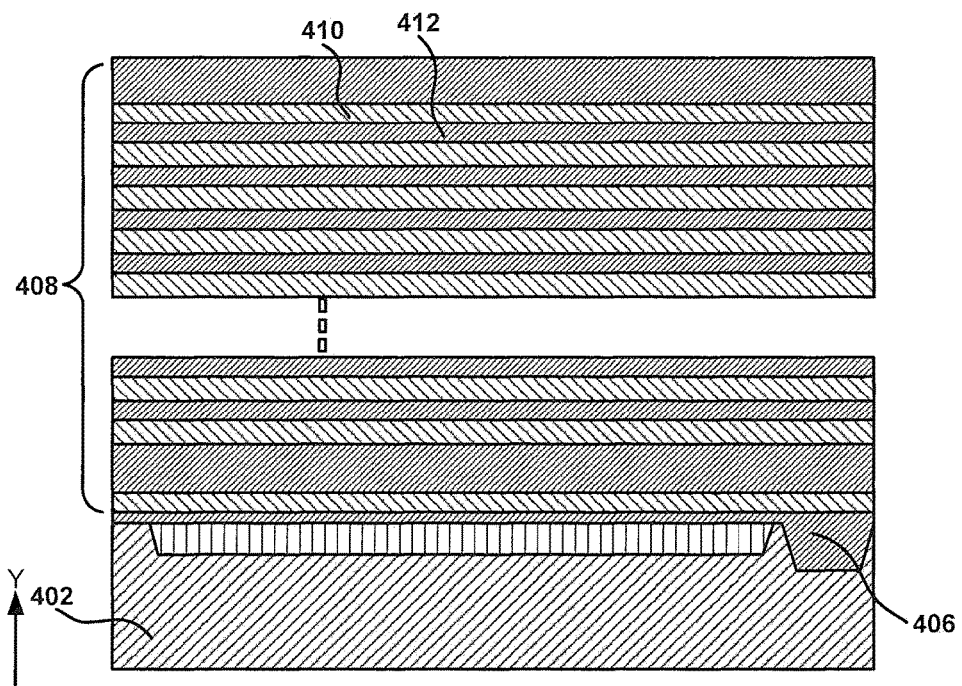

Method 700 proceeds to operation 704, as illustrated in FIG. 7, in which a plurality of dielectric layer pairs (also referred to herein as an "alternating dielectric stack") are formed on the second substrate. As illustrated in FIG. 4B, a plurality of dielectric layer 410 and dielectric layer 412 layer pairs are formed on second silicon substrate 402. The plurality of dielectric pairs can form an alternating dielectric stack 408. Alternating dielectric stack 408 can include an alternating stack of a first dielectric layer 410 and a second dielectric layer 412 that is different from first dielectric layer 410. In some embodiments, each dielectric layer pair includes a layer of silicon nitride and a layer of silicon oxide. In some embodiments, there are more layers than the dielectric layer pairs made of different materials and with different thicknesses in alternating dielectric stack 408. Alternating dielectric stack 408 an be formed by one or more thin film deposition processes including, but not limited to, CVD, PVD, ALD, or any combination thereof. In some embodiments, alternating dielectric stack 408 can be replaced by a plurality of conductor/dielectric layer pairs, i.e., an alternating stack of a conductor layer (e.g., polysilicon) and a dielectric layer (e.g., silicon oxide).

Method 700 proceeds to operation 706, as illustrated in FIG. 7, in which a plurality of NAND strings of the array device are formed on the second substrate. As illustrated by in FIG. 4C, a plurality of NAND strings 418 are formed on second silicon substrate 402. Each first dielectric layer 410 of alternating dielectric stack 408 can be replaced by a conductor layer 416, thereby forming a plurality of conductor/dielectric layer pairs in an alternating conductor/dielectric stack 414. The replacement of first dielectric layers 410 with conductor layers 416 can be performed by wet etching first dielectric layers 410 selective to second dielectric layers 412 and filling the structure with conductor layers 416. Conductor layers 416 can be filled by CVD, ALD, any other suitable process, or any combination thereof. Conductor layers 416 can include conductor materials including, but not limited to, W, Co, Cu, Al, polysilicon, silicides, or any combination thereof.

In some embodiments, fabrication processes to form NAND strings 418 further include forming a semiconductor channel 420 that extends vertically through alternating conductor/dielectric stack 414. In some embodiments, fabrication processes to form NAND strings 418 further include forming a dielectric layer 422 between semiconductor channel 420 and the plurality of conductor/dielectric layer pairs in alternating conductor/dielectric stack 414. Dielectric layer 422 can be a composite dielectric layer including, but not limited to, a tunneling layer, a storage layer, and a blocking layer. The tunneling layer can include dielectric materials including, but not limited to, silicon oxide, silicon nitride, silicon oxynitride, or any combination thereof. The storage layer can include materials for storing charge for memory operation. The storage layer materials include, but are not limited to, silicon nitride, silicon oxynitride, a combination of silicon oxide and silicon nitride, or any combination thereof. The blocking layer can include dielectric materials including, but not limited to, silicon oxide or a combination of silicon oxide/silicon nitride/silicon oxide (ONO). The blocking layer can further include a high-k dielectric layer (e.g., aluminum oxide). Dielectric layer 422 can be formed by processes such as ALD, CVD, PVD, any other suitable processes, or any combination thereof.

Figure 4C:
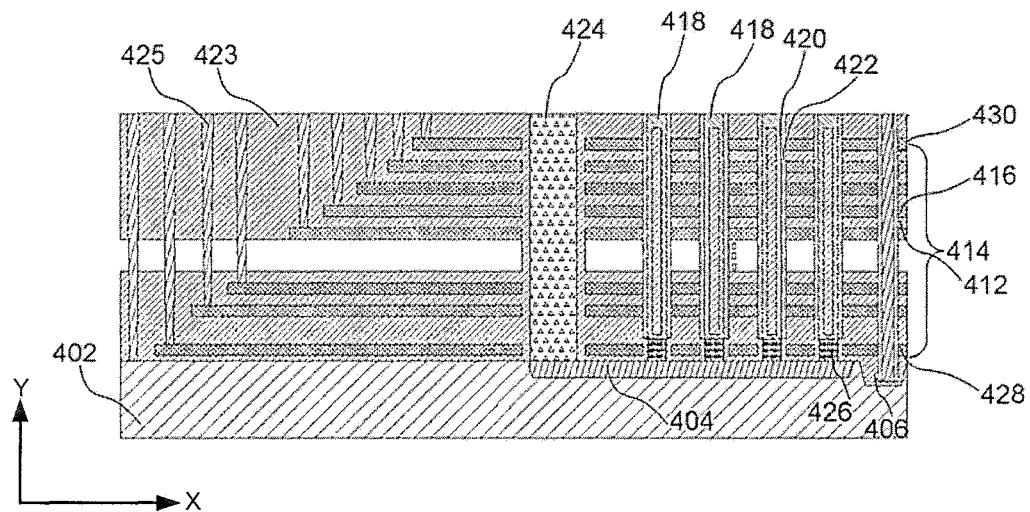

In some embodiments, fabrication processes to form NAND strings 418 further include forming an epitaxial layer 426 at an end of NAND string 418. As illustrated in FIG. 4C, epitaxial layer 426 can be formed at a lower end of each NAND string 418 as an epitaxial plug 426. Epitaxial layer 426 can be a silicon layer epitaxially grown from second silicon substrate 402 and can be implanted to a desired doping level.

In some embodiments, operation 706 further includes forming one or more source contacts. As illustrated in FIG. 4C, a source contact 424 that extends vertically through alternating conductor/dielectric stack 414 can be formed on second silicon substrate 402. Source contact 424 can have an end in contact with doped region 404 of second silicon substrate 402. In some embodiments, source contact 424 is electrically connected to NAND strings 418 by doped region 404 of second silicon substrate 402. A select gate 428 can be formed at an end of NAND string 418 to turn on or turn off doped region 404 of second silicon substrate 402 and control a conduction between source contact 424 and NAND strings 418. Source contact 424 can include conductor materials including, but not limited to, W, Co, Cu, Al, doped silicon, silicides, or any combination thereof. Source contact 424 can be formed by a dry/wet etch process to form a vertical opening through alternating conductor/dielectric stack 414, followed by a fill process to fill the opening with conductor materials and other materials (e.g., dielectric materials). The opening can be filled by ALD, CVD, PVD, electroplating, any other suitable processes, or any combination thereof.

In some embodiments, operation 706 further includes forming one or more word line contacts. As illustrated in FIG. 4C, word line contacts 425 are formed on second silicon substrate 402. Each word line contact 425 can extend vertically through a dielectric layer 423. In some embodiments, an end of word line contact 425 lands on a word line of NAND strings 418 (e.g., a conductor layer 416), such that each word line contact 425 is electrically connected to a corresponding conductor layer 416. Each word line contact 425 can be electrically connected to a corresponding conductor layer 416 to individually address a corresponding word line of NAND strings 418. One or more word line contacts 425 can further contact second silicon substrate 402 or a select gate of NAND string 418 (e.g., source select gate 428 or drain select gate 430).

In some embodiments, fabrication processes to form word line contacts 425 include forming a vertical opening through dielectric layer 423 using dry/wet etch process, followed by filling the opening with conductor materials and other materials (e.g., a barrier layer, an adhesion layer, and/or a seed layer) for conductor filling, adhesion, and/or other purposes. Word line contacts 425 can include conductor materials including, but not limited to, W, Co, Cu, Al, doped silicon, silicides, or any combination thereof. The openings of word line contacts 425 can be filled with conductor materials and other materials by ALD, CVD, PVD, electroplating, any other suitable processes, or any combination thereof.

Figure 4D:
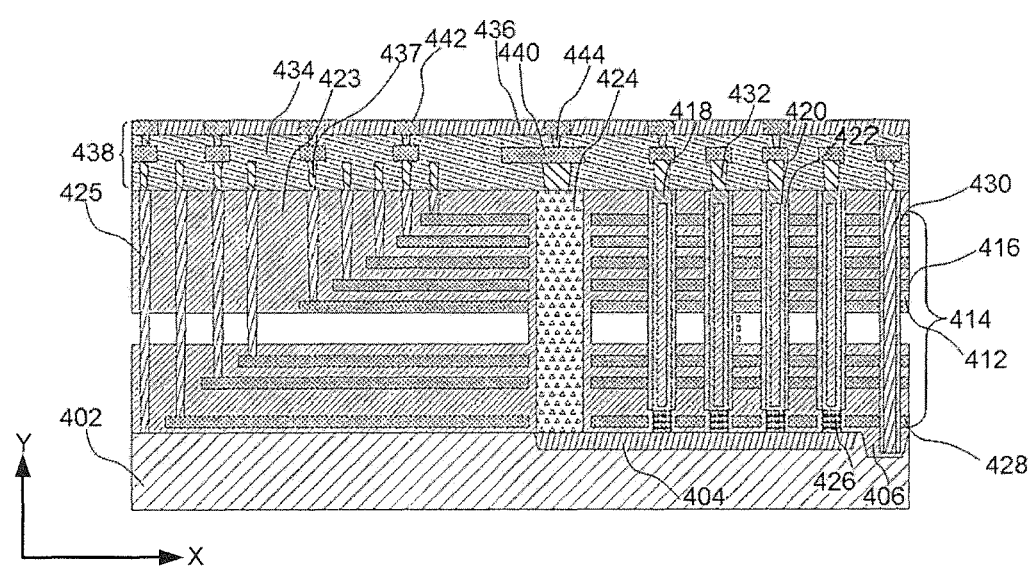

Method 700 proceeds to operation 708, as illustrated in FIG. 7, in which an array interconnect layer is formed above the plurality of NAND strings. The array interconnect layer can transfer electrical signals between the NAND strings and other parts of the 3D memory devices, such as the peripheral device. As illustrated in FIG. 4D, an array interconnect layer 438 is formed above NAND strings 418. In some embodiments, fabrication processes to form array interconnect layer 438 include forming a dielectric layer 434, followed by forming a plurality of bit line contacts 432 in contact with NAND strings 418 in dielectric layer 434. Dielectric layer 434 can include one or more layers of dielectric materials such as silicon oxide, silicon nitride, silicon oxynitride, or any combination thereof. Bit line contacts 432 can be formed by forming openings in dielectric layer 434, followed by filling the openings with conductor materials and dielectric materials. Bit line contacts 432 can include conductor materials including, but not limited to, W, Co, Cu, Al, doped silicon, silicides, or any combination thereof. The openings of bit line contacts 432 can be filled with conductor materials and dielectric materials by ALD, CVD, PVD, any other suitable processes, or any combination thereof.

In some embodiments, fabrication processes to form array interconnect layer 438 further include forming a plurality of word line vias 437 in dielectric layer 434. Each word line via 437 can contact an end of a corresponding word line contact 425 to enable electrical connections. Word line vias 437 can be formed by forming openings in dielectric layer 434, followed by filling the openings with conductor materials. Other materials, such as barrier materials and/or seed layer materials, can also be used to partially fill the openings before filling the conductor materials to enhance the adhesion or filling performance of the conductor materials. Word line vias 437 can include conductor materials including, but not limited to, W, Co, Cu, Al, doped silicon, silicides, or any combination thereof. The openings of word line vias 437 can be filled with conductor materials and barrier materials by ALD, CVD, PVD, electroplating, any other suitable processes, or any combination thereof.

In some embodiments, fabrication process to form array interconnect layer 438 further include forming one or more conductor layers (e.g., conductor layer 440) and one or more contact layers 444 in dielectric layer 434. Conductor layer 440 and contact layer 444 can include conductor materials including, but not limited to, W, Co, Cu, Al, doped silicon, silicides, or any combination thereof. Conductor layers 440 and conductor contact layers 444 can be formed by any suitable known BEOL methods.

In some embodiments, fabrication processes to form array interconnect layer 438 further include forming a top conductor layer 442 and a top dielectric layer 436. Top conductor layer 442 can include conductor materials including, but not limited to, W, Co, Cu, Al, doped silicon, silicides, or any combination thereof. Dielectric layer 436 can include dielectric materials including, but not limited to, silicon oxide, silicon nitride, silicon oxynitride, or any combination thereof.

Figure 5A:
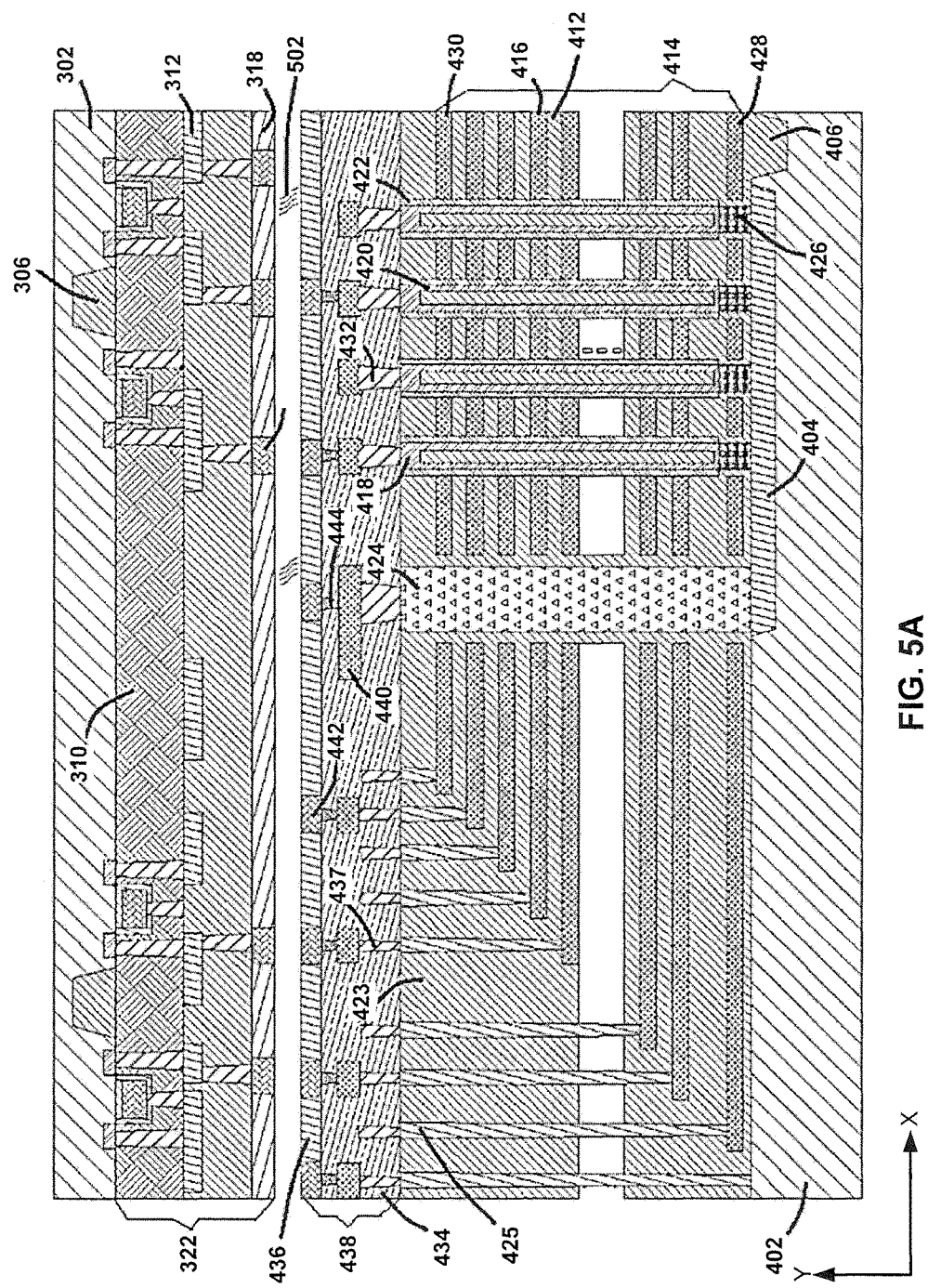
FIGS. 5A-5C illustrate an exemplary fabrication process for forming a 3D memory device with an array device bonded to a peripheral device, according to some embodiments.
Figure 5B:
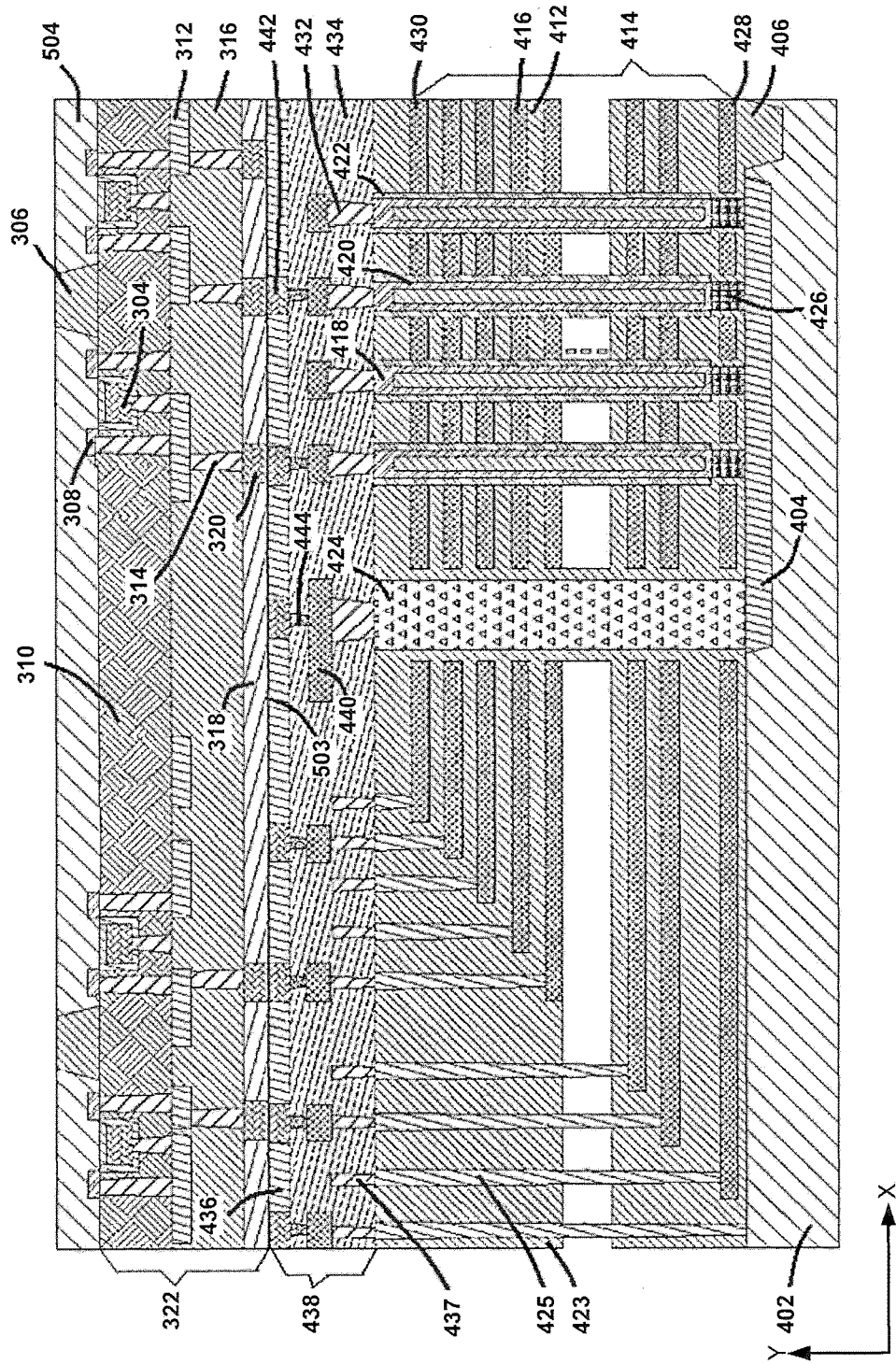
Figure 5C:
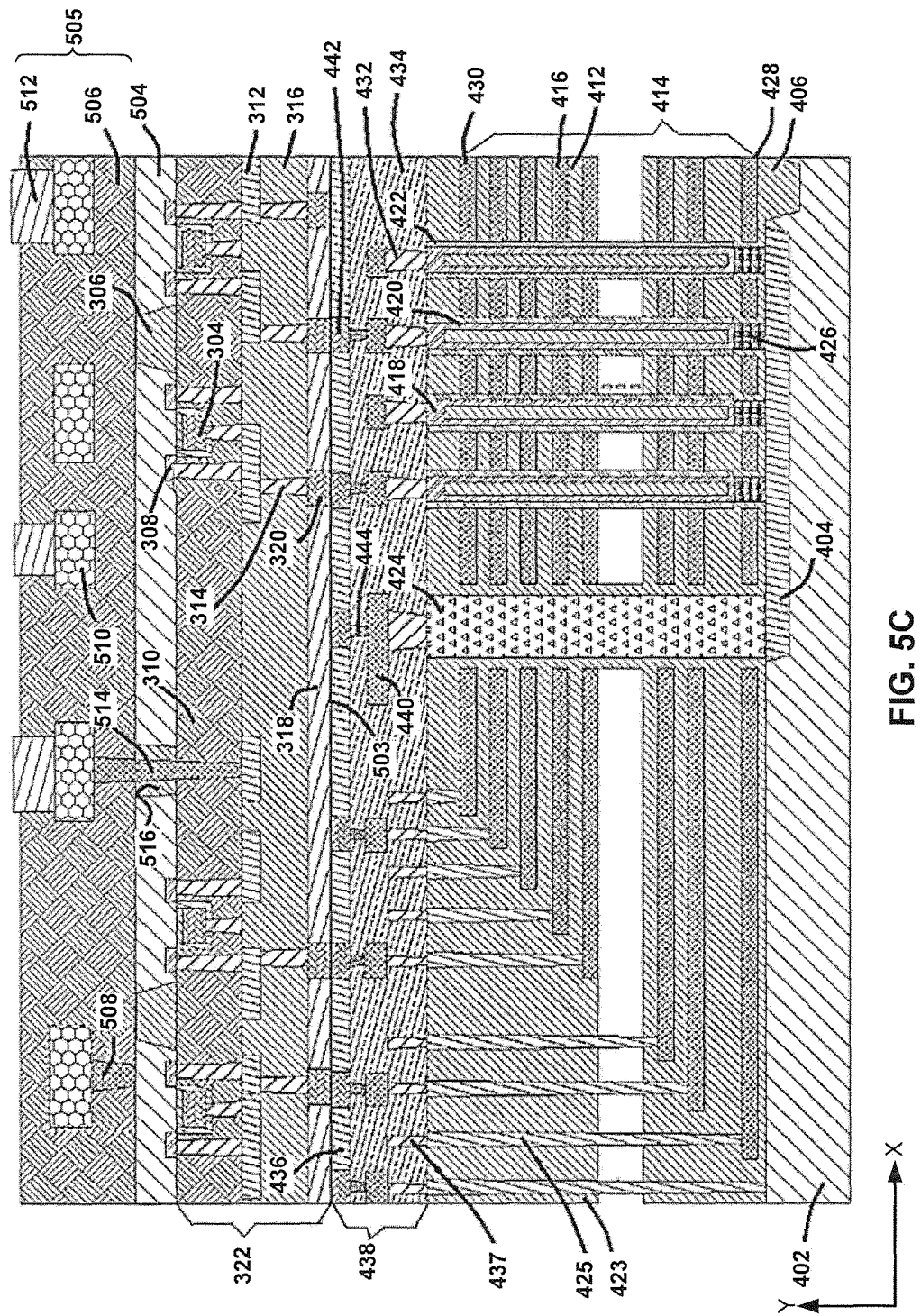
Figure 8:
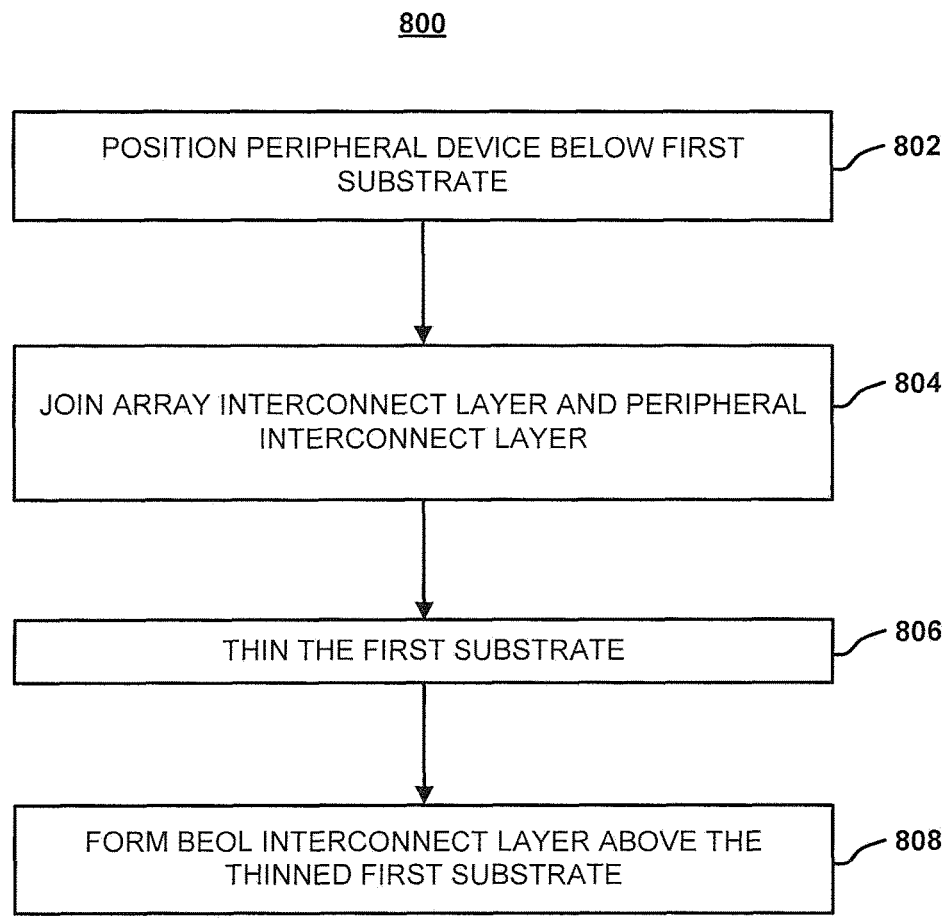
FIG. 8 is a flowchart of an exemplary method for joining a peripheral device and an array device, according to some embodiments.

FIG. 5A to FIG. 5C illustrate an exemplary fabrication process for forming a 3D memory device with an array device bonded with a peripheral device. FIG. 8 is a flowchart for an exemplary method 800 of joining the array device and the peripheral device. An example of the 3D memory device depicted in FIGS. 5A-5C and FIG. 8 is 3D memory device 200 described in FIG. 2. It should be understood that the operations shown in method 800 are not exhaustive and that other operations can be performed as well before, after, or between any of the illustrated operations.

Referring to FIG. 8, method 800 starts at operation 802, in which the peripheral device (and the peripheral interconnect layer) is positioned below the first substrate (e.g., by flipping the first substrate upside down) and the peripheral interconnect layer is aligned with the array interconnect layer. As illustrated in FIG. 5A, peripheral interconnect layer 322 can be placed below first silicon substrate 302. In some embodiments, aligning array interconnect layer 438 with peripheral interconnect layer 322 is performed by aligning conductor layer 442 of array interconnect layer 438 with conductor layer 320 of peripheral interconnect layer 322. As a result, conductor layer 442 can contact conductor layer 320 when the peripheral device is joined with the array device.

Method 800 proceeds to operation 804, as illustrated in FIG. 8, in which the array interconnect layer is joined with the peripheral interconnect layer. The array interconnect layer can be joined with the peripheral interconnect layer by flip-chip bonding the first and second substrates. In some embodiments, the array interconnect layer and the peripheral interconnect layer are joined by hybrid bonding of the first substrate and the second substrate in a face-to-face manner, such that the peripheral interconnect layer is above and in contact with the array interconnect layer in the resulting 3D memory device. Hybrid bonding (also known as "metal/dielectric hybrid bonding") can be a direct bonding technology (e.g., forming bonding between surfaces without using intermediate layers, such as solder or adhesives), which obtains metal-metal bonding and dielectric-dielectric bonding simultaneously. As illustrated in FIG. 5B, array interconnect layer 438 can be joined with peripheral interconnect layer 322, thereby forming a bonding interface 503.

As illustrated in FIG. 5A, a treatment process 502 can be used to enhance the bonding strength between array interconnect layer 438 and peripheral interconnect layer 322 before or during the joining process of the two interconnect layers. In some embodiments, each of dielectric layer 436 and dielectric layer 318 include silicon oxide or silicon nitride. In some embodiments, treatment process 502 includes a plasma treatment that treats the surfaces of array interconnect layer 438 and peripheral interconnect layer 322 so that the surfaces of the two interconnect layers form chemical bonds between dielectric layer 436 and dielectric layer 318. In some embodiments, treatment process 502 includes a wet process that treats the surfaces of array interconnect layer 438 and peripheral interconnect layer 322 so that the surfaces of the two interconnect layers form preferable chemical bonds to enhance the bonding strength between two dielectric layers 436 and 318.

In some embodiments, treatment process 502 includes a thermal process that can be performed at a temperature from about 250° C. to about 600° C. (e.g., from 250° C. to 600° C.). The thermal process can cause inter-diffusion between conductor layer 442 and conductor layer 320. As a result, conductor layer 442 can be inter-mixed with conductor layer 320 after the joining process. Conductor layer 442 and conductor layer 320 can each include Cu.

Method 800 proceeds to operation 806, as illustrated in FIG. 8, in which the first substrate is thinned, so that the thinned first substrate serves as a semiconductor layer above the peripheral devices. As illustrated in FIG. 5B, the thinned first silicon substrate 302 can be a single crystalline silicon layer 504. In some embodiments, after the thinning process, single crystalline silicon layer 504 has a thickness between about 200 nm and about 5 μm, such as between 200 nm and 5 μm (e.g., 200 nm, 300 nm, 400 nm, 500 nm, 600 nm, 700 nm, 800 nm, 900 nm, 1 μm, 2 μm, 3 μm, 4 μm, 5 μm, any range bounded on the lower end by any of these values, or in any range defined by any two of these values). In some embodiments, single crystalline silicon layer 504 has a thickness between about 150 nm and about 50 μm, such as between 150 nm and 50 μm (e.g., 150 nm, 200 nm, 300 nm, 400 nm, 500 nm, 1 μm, 5 μm, 10 μm, 15 μm, 20 μm, 25 μm, 30 μm, 35 μm, 40 μm, 45 μm, 50 μm, any range bounded on the lower end by any of these values, or in any range defined by any two of these values). In some embodiments, single crystalline silicon layer 504 has a thickness between about 500 nm and about 10 μm, such as between 500 nm and 10 μm (e.g., 500 nm, 600 nm, 700 nm, 800 nm, 900 nm, 1 μm, 2 μm, 3 μm, 4 μm, 5 μm, 6 μm, 7 μm, 8 μm, 9 μm, 10 μm, any range bounded on the lower end by any of these values, or in any range defined by any two of these values). In some embodiments, single crystalline silicon layer 504 has a thickness less than about 1 μm, such as less than 1 μm (e.g., 1 nm, 5 nm, 10 nm, 20 nm, 30 nm, 40 nm, 50 nm, 60 nm, 70 nm, 80 nm, 90 nm, 100 nm, 150 nm, 200 nm, 300 nm, 400 nm, 500 nm, 600 nm, 700 nm, 800 nm, 900 nm, any range bounded on the lower end by any of these values, or in any range defined by any two of these values). First substrate 302 can be thinned by processes, such as wafer grinding, dry etch, wet etch, CMP, any other suitable process, or any combination thereof.

Method 800 proceeds to operation 808, as illustrated in FIG. 8, in which a BEOL interconnect layer is formed above the semiconductor layer. As illustrated in FIG. 5C, a BEOL interconnect layer 505 is formed above single crystalline silicon layer 504. BEOL interconnect layer 505 can include a dielectric layer 506, one or more contact layers 508, one or more conductor layers 510, and one or more pad layers 512. Dielectric layer 506 can be a combination of multiple dielectric layers formed at separate process steps. Contact layer 508, conductor layer 510, and pad layer 512 can include conductor materials, such as W, Co, Cu, Al, doped silicon, silicides, any other suitable conductor material, or any combination thereof. Dielectric layer 506 can include dielectric materials, such as silicon oxide, silicon nitride, silicon oxynitride, low-k dielectrics, any other dielectric material, or any combination thereof. In some embodiments, pad layer 512 is electrically connected to external circuits or devices to transfer electrical signals between the joined array/peripheral device and the external circuits or devices.

As illustrated in FIG. 5C, a TSC 514 can be formed through single crystalline silicon layer 504 to make electrical contact between a conductor layer of peripheral interconnect layer 322 and a conductor layer of BEOL interconnect layer 505. In some embodiments, TSC 514 extends through an isolation region 516 formed in single crystalline silicon layer 504, so that the lower end of TSC 514 can contact peripheral interconnect layer 322 (e.g., conductor layer 312). In some embodiments, fabrication processes for forming TSC 514 further include forming isolation region 516 between TSC 514 and single crystalline silicon layer 504.

Various embodiments in accordance with the present disclosure provide a 3D memory device with smaller die size, higher device density, and improved performance compared with other 3D memory devices. By vertically stacking a peripheral device and BEOL interconnect above an array device, the density of 3D memory devices can be increased. Moreover, by decoupling the peripheral device processing and the array device processing, the thermal budget associated with processing the array device is not limited by the peripheral device performance requirement; similarly, the peripheral device performance is not impacted by the array device processing. For example, the peripheral device and the array device can be separately fabricated on different substrates so that certain high-temperature processes for fabricating the array device will not adversely affect the fabrication of the peripheral device (e.g., avoid excess diffusion of the dopants, control the doping concentration and/or thickness of ion implantation, etc.).

In some embodiments, a NAND memory device includes a substrate, a plurality of NAND strings on the substrate, one or more peripheral devices above the plurality of NAND strings, a single crystalline silicon layer above the one or more peripheral devices, and one or more first interconnect layers between the one or more peripheral devices and the plurality of NAND strings.

In some embodiments, a 3D memory device includes a substrate, a memory string extending vertically on the substrate, a peripheral device above the memory string, a semiconductor layer above the peripheral device, and a first interconnect layer. The peripheral device is at a first surface of the semiconductor layer. The first interconnect layer is on a second surface of the first substrate.

In some embodiments, a 3D memory device includes a substrate, an alternating conductor/dielectric stack on the substrate, a peripheral device above the alternating conductor/dielectric stack, and a plurality of memory strings extending vertically through the alternating conductor/dielectric stack. Each of the plurality of memory strings includes a semiconductor channel extending vertically through the alternating conductor/dielectric stack, a tunneling layer between the alternating conductor/dielectric stack and the semiconductor channel, a storage layer between the tunneling layer and the alternating conductor/dielectric stack, and an epitaxial plug at a lower end of the memory string and in contact with the substrate.

In some embodiments, a NAND memory device includes a first semiconductor structure, a second semiconductor structure, and a bonding interface between the first semiconductor structure and the second semiconductor structure. The first semiconductor structure includes a first substrate, a plurality of conductor/dielectric layer pairs on the first substrate, a plurality of NAND strings extending vertically through the plurality of conductor/dielectric layer pairs, and a first interconnect layer including a first conductor layer at a surface of the first interconnect layer. The second semiconductor structure includes a thinned second substrate, one or more peripheral devices below the thinned second substrate, and a second interconnect layer including a second conductor layer at a surface of the second interconnect layer. The first conductor layer contacts the second conductor layer at the bonding interface.

In some embodiments, a method for forming a NAND memory device is disclosed. A plurality of NAND strings are formed on a second substrate. One or more peripheral devices are formed on a second substrate. The one or more peripheral devices are positioned above the plurality of NAND strings. The second substrate is above the plurality of NAND strings. The plurality of NAND strings and the one or more peripheral devices are joined. The first second is thinned so that the thinned second substrate serves as a single crystalline silicon layer above the plurality of NAND strings.

In some embodiments, a method for forming a 3D memory device is disclosed. An alternating conductor/dielectric stack and a plurality of memory strings extending vertically through the alternating conductor/dielectric stack are formed on a first substrate. A first interconnect layer is formed above the memory strings on the first substrate. A peripheral device is formed on a second substrate. A second interconnect layer is formed above the peripheral device on the second substrate. The first substrate and the second substrate are bonded, so that the first interconnect layer is below and in contact with the second interconnect layer.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a substrate;
a plurality of NAND strings, wherein a first surface of the plurality of NAND strings opposes a second surface of the plurality of NAND strings, and the second surface of the plurality of NAND strings is in contact with a first surface of the substrate;
one or more first interconnect layers, wherein a first surface of the one or more first interconnect layers opposes a second surface of the one or more first interconnect layers, and the second surface of the one or more first interconnect layers is in contact with the first surface of the plurality of NAND strings;
one or more peripheral devices, wherein a first surface of the one or more peripheral devices opposes a second surface of the one or more peripheral devices, and the second surface of the one or more peripheral devices is in contact with the first surface of the one or more first interconnect layers; and
a single crystalline silicon layer, wherein a first surface of the single crystalline silicon layer opposes a second surface of the single crystalline silicon layer, and the second surface of the single crystalline silicon layer is in contact with the first surface of the one or more peripheral devices.

2. The 3D memory device of claim 1, wherein the one or more peripheral devices comprise one or more MOSFET devices.

3. The 3D memory device of claim 1, further comprising an alternating conductor/dielectric stack, wherein each of the plurality of NAND strings comprises:
   a semiconductor channel extending vertically through the alternating conductor/dielectric stack;
   a tunneling layer between the alternating conductor/dielectric stack and the semiconductor channel; and
   a storage layer between the tunneling layer and the alternating conductor/dielectric stack.

4. The 3D memory device of claim 3, further comprising a first contact, wherein the first contact extends vertically through the alternating conductor/dielectric stack and comprises a lower end in contact with the substrate.

5. The 3D memory device of claim 1, further comprising a second interconnect layer in contact with the first surface of the single crystalline silicon layer, wherein the second interconnect layer comprises one or more layers of conductor layers formed in one or more dielectric layers.

6. The 3D memory device of claim 1, wherein a NAND string of the plurality of NAND strings comprises a first NAND string in contact with a second NAND string.

7. The 3D memory device of claim 6, wherein the NAND string and the another NAND string are electrically connected by a conductor.

8. The 3D memory device of claim 1, further comprising a through silicon contact, wherein the through silicon contact extends vertically through the single crystalline silicon layer, and wherein the through silicon contact electrically connects with an interconnect layer of the one or more first interconnect layers on one end of the through silicon contact.

9. The 3D memory device of claim 1, wherein the single crystalline silicon layer comprises a doped region and an isolation region.

10. The 3D memory device of claim 1, wherein each of the plurality of NAND strings comprises an epitaxial plug at a lower end of the each of the plurality of NAND strings.

11. The 3D memory device of claim 10, wherein the epitaxial plugs of the plurality of NAND strings contact a doped region in the substrate.

12. The 3D memory device of claim 10, wherein the second surface of the plurality of NAND strings comprise surfaces of the epitaxial plugs.

13. The 3D memory device of claim 1, further comprising a plurality of contacts, wherein each contact of the plurality of contacts is in contact with the first surface of the plurality of NAND strings.

* * * * *